United States Patent
Hayashi

(10) Patent No.: US 9,620,177 B2
(45) Date of Patent: Apr. 11, 2017

(54) INTERNAL POWER SUPPLY CIRCUIT, SEMICONDUCTOR DEVICE, AND SEMICONDUCTOR DEVICE MANUFACTURING METHOD

(75) Inventor: Koichiro Hayashi, Tokyo (JP)

(73) Assignee: Longitude Semiconductor S.a.r.l., Luxembourg (LU)

( * ) Notice: Subject to any disclaimer, the term of this patent is extended or adjusted under 35 U.S.C. 154(b) by 1122 days.

(21) Appl. No.: 12/793,033

(22) Filed: Jun. 3, 2010

(65) Prior Publication Data

US 2010/0309735 A1    Dec. 9, 2010

(30) Foreign Application Priority Data

Jun. 3, 2009  (JP) .................................. 2009-133732

(51) Int. Cl.
G11C 5/14    (2006.01)
(52) U.S. Cl.
CPC ................................... G11C 5/145 (2013.01)
(58) Field of Classification Search
CPC ..................................................... G11C 5/145
USPC .......................................... 365/211, 226, 227
See application file for complete search history.

(56) References Cited

U.S. PATENT DOCUMENTS

| | | | | |
|---|---|---|---|---|
| 5,448,159 A * | 9/1995 | Kojima et al. | ................ | 323/315 |
| 6,297,624 B1 * | 10/2001 | Mitsui et al. | ................ | 323/316 |
| 7,266,031 B2 * | 9/2007 | Kim et al. | .................... | 365/211 |
| 7,961,500 B2 * | 6/2011 | Shinozaki | ..................... | 365/154 |
| 2005/0105367 A1 * | 5/2005 | Kim | ........................ | G11C 5/14 365/226 |
| 2007/0036015 A1 * | 2/2007 | Sako | ........................ | G11C 7/04 365/211 |
| 2007/0194381 A1 * | 8/2007 | Chun | ....................... | G11C 7/04 257/362 |

FOREIGN PATENT DOCUMENTS

JP    2000-150799    5/2000

* cited by examiner

*Primary Examiner* — Tha-O H Bui

(57) ABSTRACT

An internal power supply circuit supplies a power supply voltage to an internal circuit of a semiconductor device via an internal power supply line. The internal power supply circuit includes a reference potential generating circuit that is configured to generate a plurality of reference potentials having different temperature dependencies from each other, an internal voltage generating circuit that generates the power supply voltage with reference to a reference potential generated by the reference potential generating circuit, and a control circuit that selects a reference potential to be generated by the reference potential generating circuit.

10 Claims, 17 Drawing Sheets

INTERNAL POWER SUPPLY CIRCUIT, SEMICONDUCTOR DEVICE, AND SEMICONDUCTOR DEVICE MANUFACTURING METHOD

BACKGROUND OF THE INVENTION

Field of the Invention

The present invention relates to an internal power supply circuit, a semiconductor device, and a semiconductor device manufacturing method, and more particularly relates to an internal power supply circuit, a semiconductor device, and a semiconductor device manufacturing method which are capable of controlling a delay amount of an internal circuit.

Description of Related Art

A semiconductor device such as a DRAM is configured to operate not only with a voltage supplied from outside (an external voltage) but also with an internal voltage obtained by stepping up or stepping down the external voltage. The value of the internal voltage is adjusted at the time of manufacturing the semiconductor device by using a fuse trimming method or the like (see Japanese Patent Application Laid-open No. 2000-150799).

The semiconductor device includes a large number of internal circuits. An output signal of each of the internal circuits has a certain delay with respect to an input signal, and the amount of the delay varies due to a process fluctuation. Therefore, after forming the semiconductor device on a silicon wafer, it is desirable to make the amount of the delay of the output signal of each of the internal circuits adjustable.

SUMMARY

In one embodiment, there is provided a semiconductor device comprising: a reference potential generating circuit generating a plurality of reference potentials having different temperature dependencies from each other; a control circuit that selects one of the reference potentials; an internal voltage generating circuit that generates a power supply voltage with reference to the one of the reference potentials; and an internal circuit that is supplied with the power supply voltage.

In another embodiment, there is provided a semiconductor device comprising: an internal circuit that is operated by a power supply voltage; and the internal power supply circuit that supplies the power supply voltage to the internal circuit via an internal power supply line, wherein the internal power supply circuit comprising: a reference potential generating circuit that is configured to be capable of generating a plurality of reference potentials having different temperature dependencies from each other; an internal voltage generating circuit that generates the power supply voltage with reference to the reference potential generated by the reference potential generating circuit; and a control circuit that selects the reference potential to be generated by the reference potential generating circuit.

In still another embodiment, there is provided a method of manufacturing a semiconductor device including a reference potential generating circuit that generates one of a plurality of reference potentials having different temperature dependencies from each other and supplies a generated reference potential to an internal voltage generating circuit that generates a power supply voltage and a storage circuit that stores therein reference potential information indicating a reference potential to be generated by the reference potential generating circuit, the method comprising: selecting the reference potential to be generated by the reference potential generating circuit; measuring, when a power supply voltage generated by the internal voltage generating circuit is supplied to an internal circuit, a delay amount of the internal circuit; and writing reference potential information in the storage circuit based on a result of the measurement.

In still another embodiment, there is provided a method of manufacturing a semiconductor device using a power supply voltage that is defined as a sum of a first voltage in which its voltage value is changed with a change of temperature and a change amount of the voltage value can be adjusted and a second voltage in which its voltage value is not changed with a change of temperature, the method comprising: determining the second voltage at a first temperature; and adjusting the change amount at a second temperature that is different from the first temperature.

According to the present invention, it is possible to adjust a delay amount of an output signal of an internal circuit after forming a semiconductor device on a wafer.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE
PREFERRED EMBODIMENTS

Preferred embodiments of the present invention will now be explained in detail with reference to the drawings.

Figure 1:
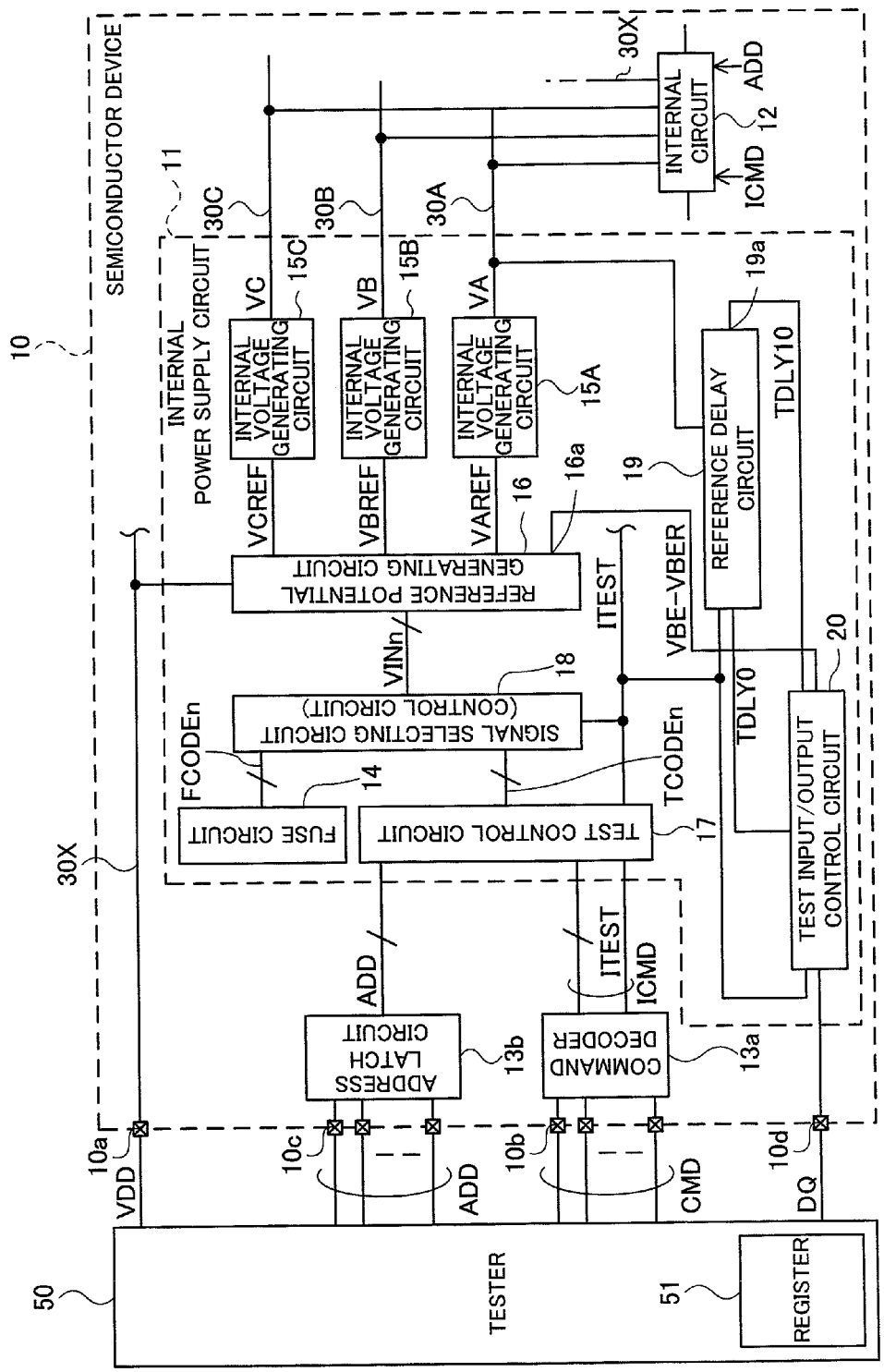
FIG. 1 is a schematic block diagram showing functional blocks of a semiconductor device according to an embodiment of the present invention and a tester that performs a test of the semiconductor device.

FIG. 1 is a schematic block diagram showing various functional blocks of a semiconductor device 10 according to an embodiment of the present invention and a tester 50 that performs a test of the semiconductor device 10.

The semiconductor device 10 is a semiconductor memory device such as a DRAM (Dynamic Random Access Memory), an SRAM (Static Random Access Memory), and a flash memory. As shown in FIG. 1, the semiconductor device 10 includes an internal power supply circuit 11, an internal circuit 12, a command decoder 13a, and an address latch circuit 13b. Furthermore, the semiconductor device 10 includes, as external terminals, a power supply terminal 10a, a command terminal 10b, an address terminal 10c, and a data input/output terminal 10d. The power supply terminal 10a is a terminal to which an external power supply voltage VDD is supplied from outside. The external power supply voltage VDD is then supplied to the internal power supply circuit 11, the internal circuit 12, and the like via an external power supply line 30X. The command terminal 10b and the address terminal 10c are terminals to which a command CMD and an address (an address signal) ADD are supplied, respectively. The data input/output terminal 10d is a terminal for inputting data DQ that is input to the internal circuit 12 and outputting data DQ that is output from the internal circuit 12. However, in a test mode that will be described later, the data input/output terminal 10d is used as a monitor terminal for monitoring the internal power supply circuit 11.

The internal power supply circuit 11 is a circuit that generates one or a plurality of internal power supply voltages VA to VC from the external power supply voltage VDD and outputs the internal power supply voltages to the internal circuit 12 of the semiconductor device 10. The internal power supply circuit 11 includes a circuit equivalent to a step-down regulator that generates an internal power supply voltage VXX that is lower than the external power supply voltage VDD, a circuit equivalent to a VPP generator that generates an internal power supply voltage VPP that is higher than the external power supply voltage VDD, and the like. Details on the internal power supply circuit 11 will be described later.

The internal circuit 12 is a circuit for implementing a main function of the semiconductor device 10. For example, when the semiconductor device 10 is a DRAM, the internal circuit 12 is corresponding to a memory cell array and its peripheral circuits. As a power supply for operating the internal circuit 12, the internal power supply voltages VA to VC that are supplied from the internal power supply circuit 11, as well as the external power supply voltage VDD that is supplied from outside, are used.

The command decoder 13a is a circuit that decodes the command CMD that is supplied from outside, to generate various internal commands ICMD. The internal commands ICMD are supplied to the internal power supply circuit 11 and the internal circuit 12. For example, when the semiconductor device 10 is a DRAM, the command CMD includes a test command for entering a test mode, as well as an active command, a read command, a write command, a pre-charge command, and the like. From among the internal commands ICMD, a command (a test signal) ITEST indicating a test mode is supplied to the internal power supply circuit 11.

The address latch circuit 13b is a circuit that latches the address ADD supplied from outside and supplies the address ADD to the internal circuit 12. Upon entering the test mode, the address ADD that is latched in the address latch circuit 13b is supplied to the internal power supply circuit 11 and used as a test code signal TCODEn (where n is a positive integer) that will be described later.

Details on the internal power supply circuit 11 are explained below.

As shown in FIG. 1, the internal power supply circuit 11 includes a fuse circuit 14, internal voltage generating circuits 15A to 15C, a reference potential generating circuit 16, a test control circuit 17, a signal selecting circuit 18, a reference delay circuit 19, and a test input/output control circuit 20.

The fuse circuit 14 is a memory circuit that includes a plurality of fuses and stores therein a code signal (a fuse code signal) FCODEn (where n is a positive integer) in a nonvolatile manner by, for example, fuse trimming at the time of manufacturing the semiconductor device. The code signal FCODEn is information (reference potential information) indicating a reference potential that is generated by the reference potential generating circuit 16.

The internal voltage generating circuits 15A to 15C are circuits that receive the external power supply voltage VDD supplied from the external power supply line 30X and generate the internal power supply voltages VA to VC, respectively. Each of the internal voltage generating circuits 15A to 15C is equivalent to the step-down regulator or the VPP generator described above. Reference potentials VAREF to VCREF of the internal power supply voltages VA to VC are supplied from the reference potential generating circuit 16 that will be described later. The internal voltage generating circuits 15A to 15C are connected to internal power supply lines 30A to 30C that are different from each other, respectively, so that each of the internal power supply voltages VA to VC is supplied to its corresponding one of the internal power supply lines 30A to 30C. The number of the internal voltage generating circuits is not limited to three.

The reference potential generating circuit 16 is a circuit that generates the reference potentials VAREF to VCREF and outputs the reference potentials VAREF to VCREF to the internal voltage generating circuits 15A to 15C, respectively. The reference potential generating circuit 16 is configured to generate a plurality of potentials having different temperature dependencies from each other for each of the reference potentials. From among the potentials having different temperature dependencies, a potential is selected based on a code signal VINn (where n is a positive integer) that will be described later, so that the reference potential generating circuit 16 generates a selected potential as the reference potential.

Furthermore, as explained in detail later, the reference potential generating circuit 16 is configured to generate a voltage VBE having a temperature dependency and a voltage VBER having substantially no temperature dependency. The value of the voltage VEER is also selected based on the code signal VINn. The reference potential generating circuit outputs a difference voltage VBE−VBER, which is a difference between the voltage VBE and the voltage VBER, from an output terminal 16a.

The test control circuit 17 is a circuit that outputs the address ADD as the test code signal TCODEn when the test signal ITEST is activated. The test signal ITEST is a signal that is activated in a test mode and is output to the signal selecting circuit 18, the reference delay circuit 19, and the test input/output control circuit 20 via the test control circuit 17. The test code signal TCODEn is reference potential information indicating a reference potential generated by the reference potential generating circuit 16, which is similar to the code signal FCODEn. The test code signal TCODEn is output to the signal selecting circuit 18.

The signal selecting circuit 18 selects either one of the test code signal TCODEn that is an output of the test control circuit 17 and the fuse code signal FCODEn that is an output of the fuse circuit 14 and outputs a selected code signal to the reference potential generating circuit 16 as the code signal VINn. Specifically, in a normal operation mode in which the semiconductor device is in a normally operating status without entering the test mode, the signal selecting circuit 18 selects the fuse code signal FCODEn and outputs the fuse code signal FCODEn to the reference potential generating circuit 16 as the code signal VINn. On the other hand, when the semiconductor device enters the test mode (when the test signal ITEST is activated), the signal selecting circuit 18 selects the test code signal TCODEn and outputs the test code signal TCODEn to the reference potential generating circuit 16 as the code signal VINn. By outputting the code signal VINn in the above manner, the signal selecting circuit 18 functions as a control circuit that selects a reference potential to be generated by the reference potential generating circuit 16.

The reference delay circuit 19 is a circuit that delays an input signal TDLY0 and outputs a signal obtained by delaying the input signal TDLY0 from an output terminal 19a as an output signal TDLY10.

Figure 2A:
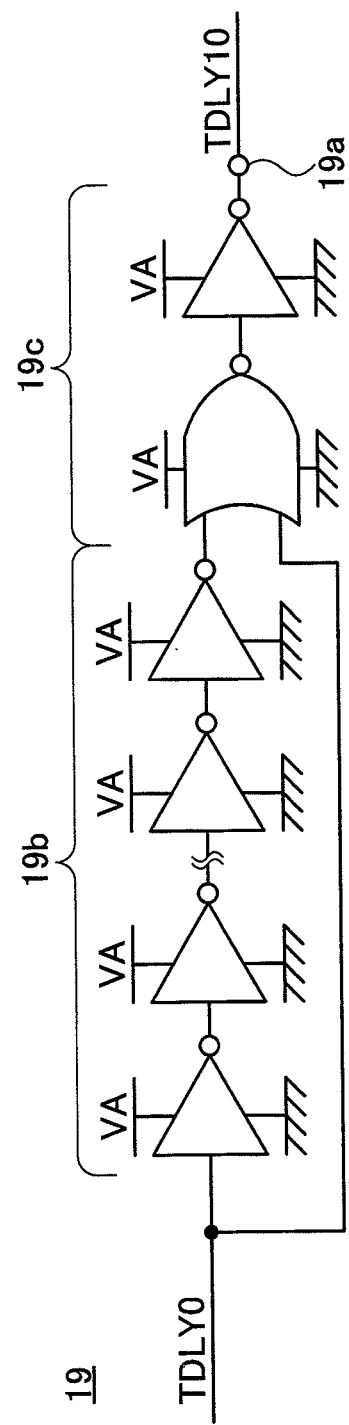
FIG. 2A is a logical circuit diagram showing an example of a circuit configuration of a reference delay circuit according to an embodiment of the present invention.

FIG. 2A is a logical circuit diagram showing an example of a circuit configuration of the reference delay circuit 19. As shown in FIG. 2A, the reference delay circuit 19 includes an inverter chain 19b and an OR circuit 19c. As a power supply voltage for the inverter chain 19b and the OR circuit 19c, the power supply voltage VA that is generated by the internal voltage generating circuit 15A is used, as shown in FIG. 2A.

Figure 2B:
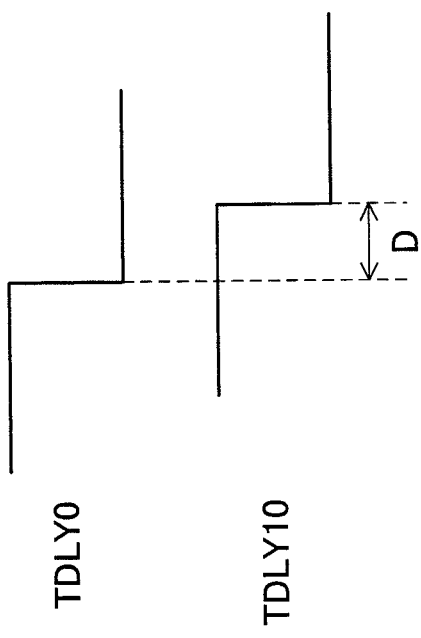
FIG. 2B shows an example of an input signal and an output signal of the reference delay circuit.

The input signal TDLY0 is input to the inverter chain 19b. An output terminal of the inverter chain 19b is connected to one input terminal of the OR circuit 19c, and the input signal TDLY0 is input to the other input terminal. With this configuration, as shown in FIG. 2B, the output signal TDLY10 that appears at an output terminal of the OR circuit 19c becomes a signal obtained by delaying the input signal TDLY0 by a predetermined time (a delay time) D. The delay time D is mainly determined by a delay amount of a signal at the inverter chain 19b. However, because the inverter chain 19b uses the voltage VA as its power supply voltage and the delay amount of the signal at the inverter chain 19b depends on its power supply voltage, the delay time D changes with a value of the voltage VA.

Referring back to FIG. 1, the test input/output control circuit 20 connects the output terminal 16a of the reference potential generating circuit 16 to the data input/output terminal 10d in response to an activation of the test signal ITEST. Furthermore, the test input/output control circuit 20 connects the output terminal 19a of the reference delay circuit 19 to the data input/output terminal 10d. Upon completion of these connections, the tester 50 can directly monitor the voltage VBE–VBER that is output to the output terminal 16a and a voltage of the signal TDLY10 that is output to the output terminal 19a.

In addition, the input signal TDLY0 is supplied to the test input/output control circuit 20 from the tester 50, and the test input/output control circuit 20 performs a process of outputting the input signal TDLY0 that is supplied from the tester 50 to the reference delay circuit 19.

Details on the reference potential generating circuit 16 are explained below.

Figure 3:
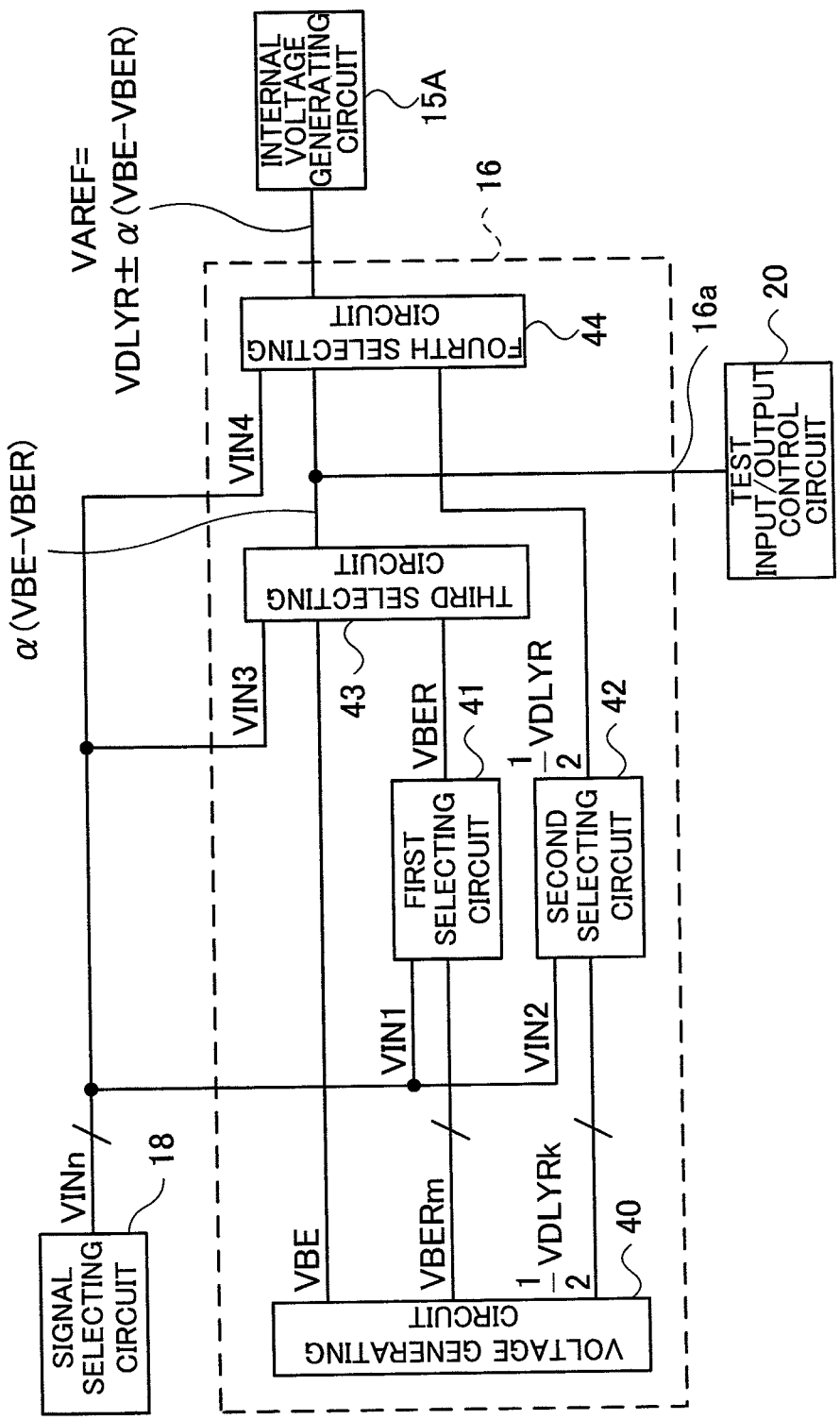
FIG. 3 is a functional block diagram of a reference potential generating circuit according to an embodiment of the present invention.

FIG. 3 is a functional block diagram of the reference potential generating circuit 16. Only a part pertaining to a generation of the reference potential VAREF is shown in FIG. 3. As shown in FIG. 3, the reference potential generating circuit 16 includes a voltage generating circuit 40 and first to fourth selecting circuits 41 to 44.

The voltage generating circuit 40 generates a voltage VBE having a negative temperature dependency, a plurality of constant voltages VBERm (where m is a positive integer in a range from 1 to M) having different voltage values from each other, and a plurality of constant voltages (½)VDLYRk (where k is a positive integer in a range from 1 to K) having different voltage values from each other.

Figure 4:
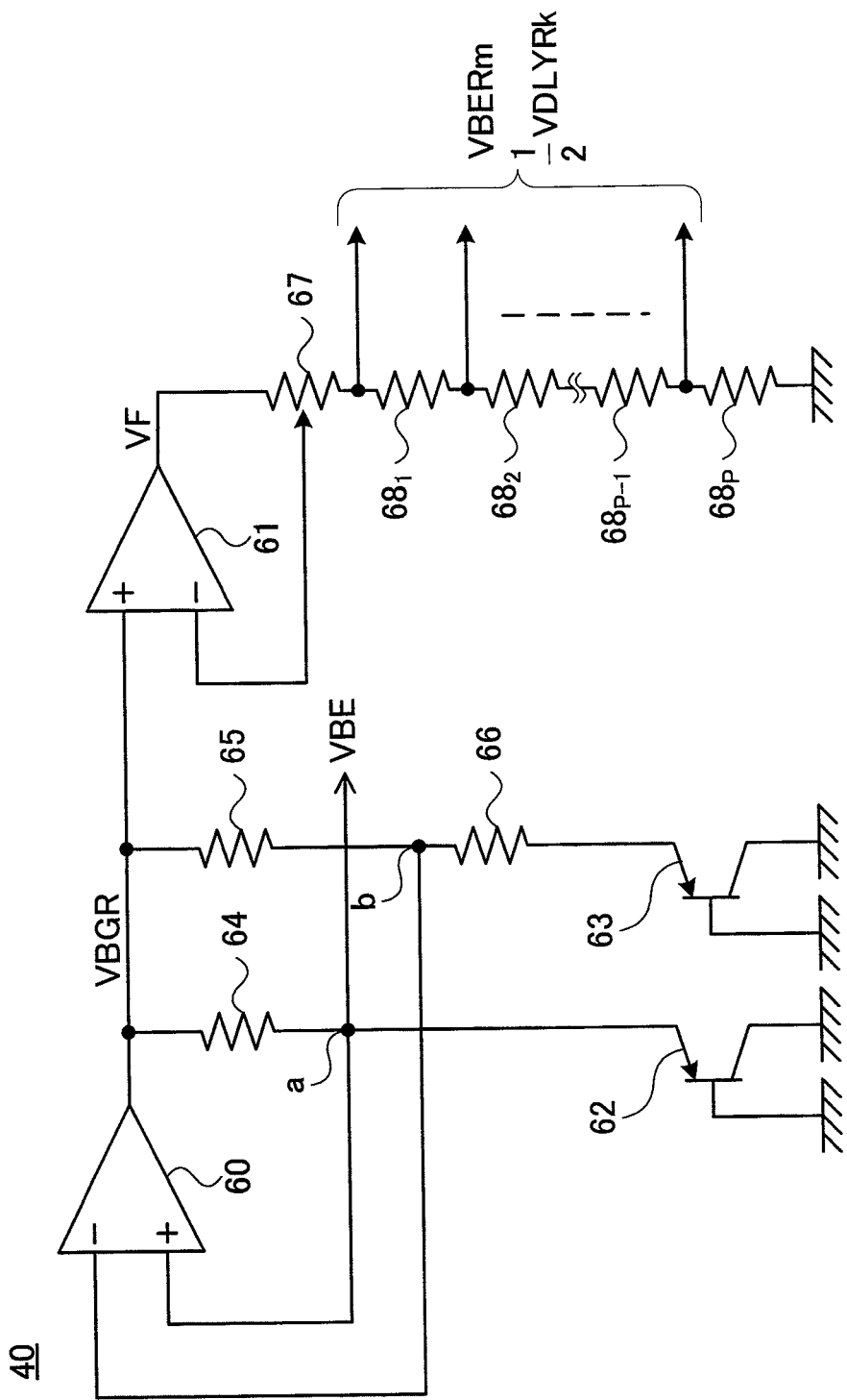
FIG. 4 is a circuit diagram of a voltage generating circuit according to an embodiment of the present invention.

FIG. 4 is a detailed circuit diagram of the voltage generating circuit 40. As shown in FIG. 4, the voltage generating circuit 40 includes operational amplifiers 60 and 61, PNP bipolar transistors 62 and 63, and resistors 64 to 67 and 68$_1$ to 68$_P$ (where P is a positive integer).

A feedback circuit that passes a connection point a is formed between an output terminal of the operational amplifier 60 and a non-inverting input terminal of the operational amplifier 60, and the resistor 64 is inserted between the connection point a and the output terminal of the operational amplifier 60. Similarly, a feedback circuit that passes a connection point b is formed between the output terminal of the operational amplifier 60 and an inverting input terminal of the operational amplifier 60, and the resistor 65 is inserted between the connection point b and the output terminal of the operational amplifier 60.

The transistor 62 is diode-connected, in which a base and a collector are connected to the ground and an emitter is connected to the connection point a. The transistor 63 is also diode-connected, in which a base and a collector are connected to the ground and an emitter is connected to the connection point b via the resistor 66.

The output terminal of the operational amplifier 60 is also connected to a non-inverting input terminal of the operational amplifier 61. The resistors 67 and 68$_1$ to 68$_P$ are connected in series in this order between an output terminal of the operational amplifier 61 and the ground. The resistor 67 is connected to an inverting input terminal of the operational amplifier 61 with a connection point variable, by which an output voltage VF of the operational amplifier 61 can be adjusted.

With the above configuration, an output voltage VBGR of the operational amplifier 60 and the output voltage VF of the operational amplifier 61 become constant voltages that do not depend on a change in the temperature or in the external power supply voltage VDD, and a voltage appearing at the connection point a becomes a voltage having a negative temperature dependency (the voltage decreases as the temperature increases). The voltage generating circuit 40 outputs the voltage appearing at the connection point a as the voltage VBE. A rate of change of the voltage VBE with respect to the temperature is kept constant.

Meanwhile, the constant voltages VBERm and the constant voltages (½)VDLYRk are generated by dividing the voltage VF with the resistors. The voltage generating circuit 40 includes a lead at each connection point of the resistors 67 and 68$_1$ to 68$_P$ that are connected in series, so that it outputs voltages appearing at the leads as the constant voltages VBERm and the constant voltages (½)VDLYRk. The values of the constant voltages VBERm and the constant voltages (½) VDLYRk can be determined by appropriately selecting resistances of the resistors 67 and 68$_1$ to 68$_P$.

Figure 5:
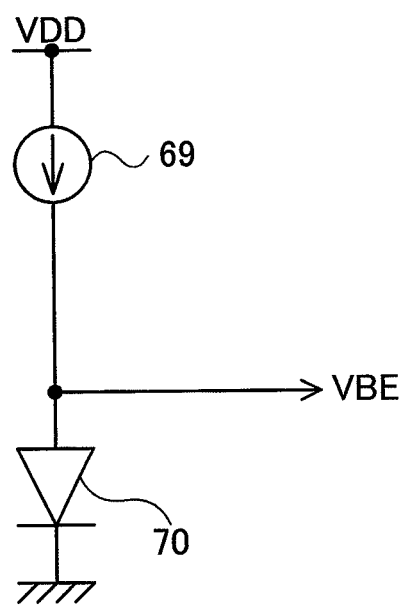
FIG. 5 is a circuit diagram of another circuit realizing a part of functions of the voltage generating circuit.

Alternatively, the voltage VBE can be generated by using a circuit shown in FIG. 5. The circuit shown in FIG. 5 has a configuration in which a constant current source 69 and a diode 70 are connected in series between the external power supply line 30X and the ground. The voltage VBE is taken from a connection point of the constant current source 69 and the diode 70. This configuration also provides the voltage VBE that has a negative temperature dependency with a constant rate of change with respect to the temperature.

Referring back to FIG. 3, the code signal VINn is input from the signal selecting circuit 18 to the reference potential generating circuit 16. The code signal VINn is the reference potential information indicating the reference potential that is generated by the reference potential generating circuit 16, as described above. More specifically, the code signal VINn is configured with four code signals VIN1 to VIN4 corresponding to the first to the fourth selecting circuits 41 to 44, respectively.

The code signal VIN1 is information indicating a constant voltage to be selected by the first selecting circuit 41 from among the constant voltages VBERm. The first selecting circuit 41 selects a constant voltage from the constant voltages VBERm according to the code signal VIN1, and outputs a selected constant voltage to the third selecting circuit 43 as the constant voltage VEER.

The code signal VIN2 is information indicating a constant voltage to be selected by the second selecting circuit 42 from among the constant voltages (½)VDLYRk. The second selecting circuit 42 selects a constant voltage from the constant voltages (½)VDLYRk according to the code signal VIN2, and outputs a selected constant voltage to the fourth selecting circuit 44 as a constant voltage (½)VDLYR.

The code signal VIN3 is information indicating a change coefficient α of the reference potential VAREF with respect to the temperature. The third selecting circuit 43 first generates a difference voltage VBE−VBER between the voltage VBE generated by the voltage generating circuit 40 and the constant voltage VBER input from the first selecting circuit 41. Furthermore, by dividing the difference voltage VBE−VBER with the resistors, the third selecting circuit 43 generates a plurality of voltages (q/Q)(VBE−VBER) (where q is a positive integer in a range from 1 to Q). The third selecting circuit 43 then selects a voltage from the voltages (q/Q)(VBE−VBER) according to the code signal VIN3, and outputs a selected voltage to the fourth selecting circuit 44 and the test input/output control circuit 20 as a voltage α(VBE−VBER).

The code signal VIN4 is information indicating whether the temperature dependency of the reference potential VAREF is positive or negative. When the temperature dependency indicated by the code signal VIN4 is positive, the fourth selecting circuit 44 generates a voltage VDLYR−α(VBE−VBER) by using the constant voltage (½)VDLYR and the voltage α(VBE−VBER) and outputs the voltage VDLYR−α(VBE−VBER) to the internal voltage generating circuit 15A as the potential VAREF. On the other hand, when the temperature dependency indicated by the code signal VIN4 is negative, the fourth selecting circuit 44 generates a voltage VDLYR+α(VBE−VBER) and outputs the voltage VDLYR+α(VBE−VBER) to the internal voltage generating circuit 15A as the potential VAREF.

Details on specific circuit configurations of the first to the fourth selecting circuits 41 to 44 are explained below.

Figure 6:
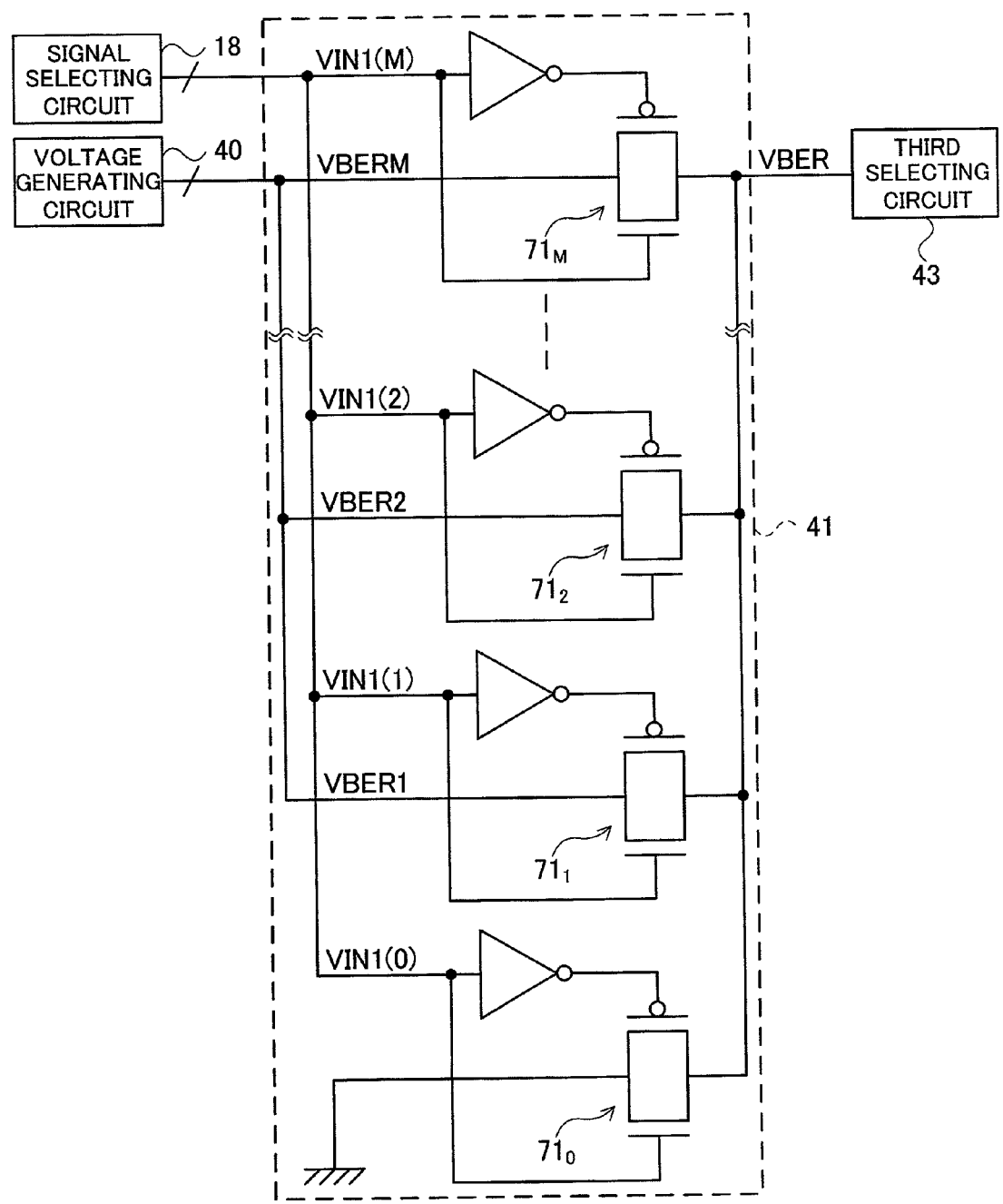
FIG. 6 is a circuit diagram of a first selecting circuit according to an embodiment of the present invention.

FIG. 6 is a detailed circuit diagram of the first selecting circuit 41. As shown in the drawing, the first selecting circuit 41 includes transfer gates 71$_0$ to 71$_M$ to which a ground potential and the voltages VBER1 to VBERM are input, respectively. Outputs of the transfer gates 71$_0$ to 71$_M$ are connected to the third selecting circuit 43. Furthermore, code signal components VIN1(0) to VIN1(M) constituting the code signal VIN1 are input to gates of the transfer gates 71$_0$ to 71$_M$, respectively.

The code signal components VIN1(0) to VIN1(M) are configured in such a manner that only one code signal component is activated while the others are non-activated. Therefore, when a code signal component VIN1($m$) (where m is a positive integer in a range from 1 to M) is activated, its corresponding transfer gate 71$_m$ becomes conductive while the other transfer gates become nonconductive, so that a voltage VBERm is output to the third selecting circuit 43 as the voltage VBER. When the code signal component VIN1(0) is activated, its corresponding transfer gate 71$_0$ becomes conductive while the others are non-activated, so that the ground potential is output to the third selecting circuit 43 as the voltage VBER.

Figure 7:
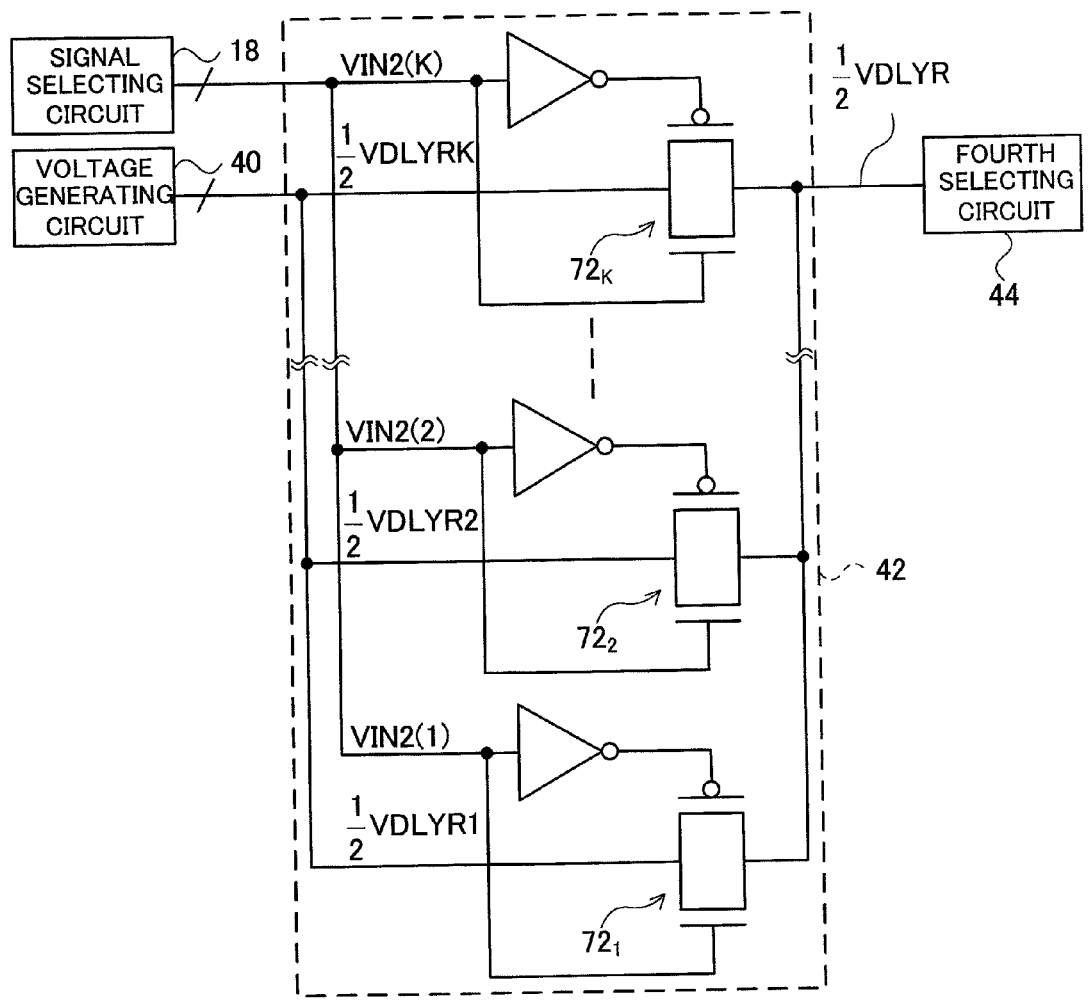
FIG. 7 is a circuit diagram of a second selecting circuit according to an embodiment of the present invention.

FIG. 7 is a detailed circuit diagram of the second selecting circuit 42. As shown in FIG. 7, the second selecting circuit 42 includes transfer gates 72$_1$ to 72$_K$ to which voltages (½)VDLYR1 to (½)VDLYRK are input, respectively. Outputs of the transfer gates 72$_1$ to 72$_K$ are connected to the fourth selecting circuit 44. Furthermore, code signal components VIN2(1) to VIN2(K) constituting the code signal VIN2 are input to gates of the transfer gates 72$_1$ to 72$_K$, respectively.

The code signal components VIN2(1) to VIN2(K) are configured in such a manner that only one code signal component is activated while the others are non-activated. Therefore, when a code signal component VIN2($k$) (where k is a positive integer in a range from 1 to K) is activated, its corresponding transfer gate 72$_k$ becomes conductive while the other transfer gates become nonconductive, so that a voltage (½)VDLYRk is output to the third selecting circuit 43 as the voltage (½)VDLYR.

Figure 8:
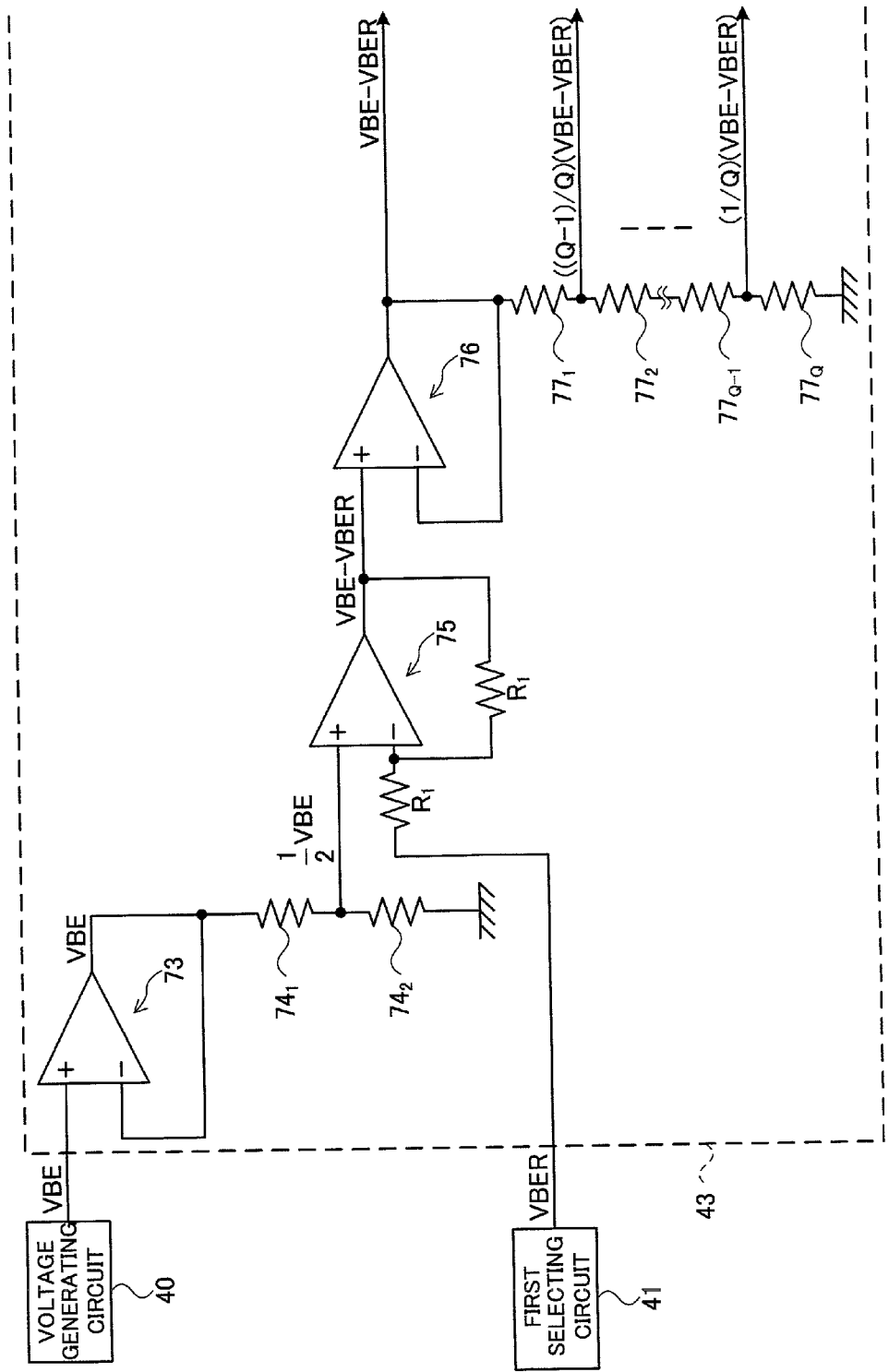
FIG. 8 is a circuit diagram of a third selecting circuit according to an embodiment of the present invention.
Figure 9:
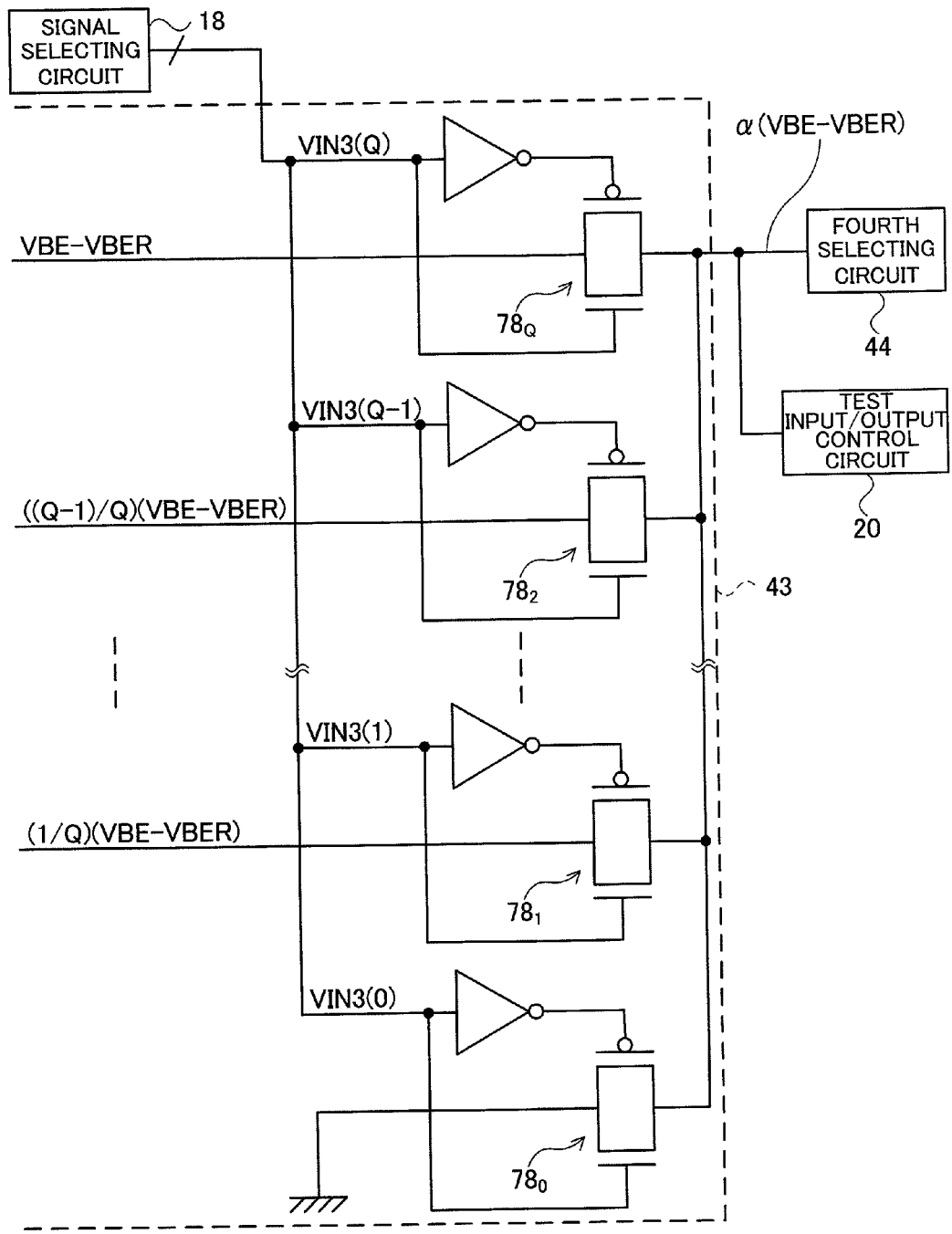
FIG. 9 is a circuit diagram of a third selecting circuit according to an embodiment of the present invention.

FIGS. 8 and 9 are detailed circuit diagrams of the third selecting circuit 43. As shown in FIGS. 8 and 9, the third selecting circuit 43 includes voltage followers 73 and 76, a subtracting circuit 75, resistors 74$_1$, 74$_2$, and 77$_1$ to 77$_Q$, and transfer gates 78$_0$ to 78$_Q$.

The voltage VBE is input from the voltage generating circuit 40 to a non-inverting input terminal of the voltage follower 73. Therefore, a potential at an output terminal of the voltage follower 73 is the same as the voltage VBE.

The resistors 74$_1$ and 74$_2$ have the same resistance, being connected in series between the output terminal of the voltage follower 73 and the ground. Therefore, a voltage at a connection point between the resistors 74$_1$ and 74$_2$ becomes (½)VBE by the voltage division with the resistors, and the voltage (½)VBE is input to a non-inverting input terminal of the subtracting circuit 75.

An inverting input terminal of the subtracting circuit 75 is connected to an output terminal of the first selecting circuit 41 and an output terminal of the subtracting circuit itself via resistors having the same resistance $R_1$, respectively. Because the voltage VBER is supplied to the inverting input terminal and the voltage (½)VBE is supplied to the non-inverting input terminal as described above, a potential at the output terminal of the subtracting circuit 75 becomes a voltage VBE−VBER. The voltage VBE−VBER is input to a non-inverting input terminal of the voltage follower 76. Therefore, a potential at an output terminal of the voltage follower 76 also becomes the voltage VBE−VBER.

The resistors $77_1$ and $77_Q$ have the same resistance, being connected in series between the output terminal of the voltage follower 76 and the ground. Therefore, potentials at connection points of the resistors are (1/Q)(VBE−VBER), . . . , ((Q−1)/Q)(VBE−VBER) in the order from the ground side. As a result, a plurality of voltages is generated with an interval of (1/Q)(VBE−VBER).

The generated voltages with the interval of (1/Q)(VBE−VBER) (including the ground potential) are, as shown in FIG. 9, input to the transfer gates $78_0$ to $78_Q$ in the order from the lowest voltage, respectively. Outputs of the transfer gates $78_0$ to $78_Q$ are connected to the fourth selecting circuit 44 and the test input/output control circuit 20. Furthermore, code signal components VIN3(0) to VIN3(Q) constituting the code signal VIN3 are input to gates of the transfer gates $78_0$ to $78_Q$, respectively.

The code signal components VIN3(0) to VIN3(Q) are configured in such a manner that only one code signal component is activated while the others are non-activated. Therefore, when a code signal component VIN3(q) (where q is a positive integer in a range from 1 to Q) is activated, its corresponding transfer gate $78_q$ becomes conductive while the other transfer gates become nonconductive, so that a voltage α(VBE−VBER) (where α=q/Q) is output to the fourth selecting circuit 44 and the test input/output control circuit 20. When the code signal component VIN3(0) is activated, its corresponding transfer gate $78_0$ becomes conductive while the others are non-activated, so that the ground potential is output to the fourth selecting circuit 44 and the test input/output control circuit 20.

Figure 10:
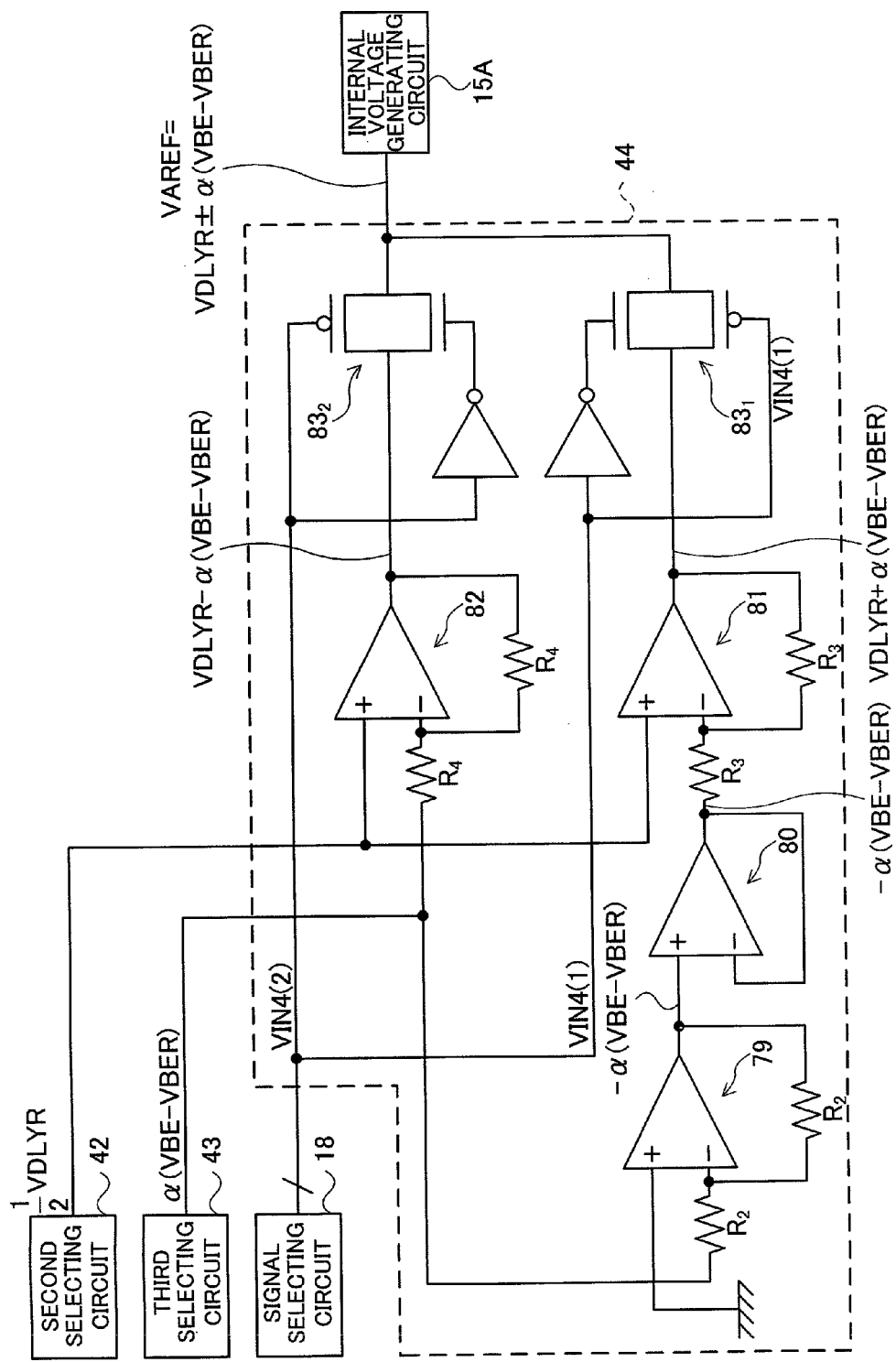
FIG. 10 is a circuit diagram of a fourth selecting circuit according to an embodiment of the present invention.

FIG. 10 is a detailed circuit diagram of the fourth selecting circuit 44. As shown in FIG. 10, the fourth selecting circuit 44 includes an inverting amplifier 79, a voltage follower 80, subtracting circuits 81 and 82, and transfer gates $83_1$ and $83_2$.

An inverting input terminal of the inverting amplifier 79 is connected to an output terminal of the third selecting circuit 43 and an output terminal of the inverting amplifier itself via resistors having the same resistance $R_2$, respectively. Therefore, the voltage α(VBE−VBER) is supplied to the inverting input terminal. A non-inverting input terminal of the inverting amplifier 79 is grounded. With this configuration, a potential at the output terminal of the inverting amplifier 79 becomes −α(VBE−VBER), which is an input voltage with the sign inverted. The voltage −α(VBE−VBER) is input to a non-inverting input terminal of the voltage follower 80. Therefore, a potential at an output terminal of the voltage follower 80 also becomes the voltage −α(VBE−VBER).

An inverting input terminal of the subtracting circuit 81 is connected to the output terminal of the voltage follower 80 and an output terminal of the subtracting circuit 81 itself via resistors having the same resistance $R_3$, respectively. Therefore, the voltage −α(VBE−VBER) is supplied to the inverting input terminal. A non-inverting input terminal of the subtracting circuit 81 is connected to the second selecting circuit 42, so that the voltage (½)VDLYR is supplied to the non-inverting input terminal. With this configuration, a potential at the output terminal of the subtracting circuit 81 becomes VDLYR+α(VBE−VBER).

An inverting input terminal of the subtracting circuit 82 is connected to the output terminal of the third selecting circuit 43 and an output terminal of the subtracting circuit 82 itself via resistors having the same resistance $R_4$, respectively. Therefore, the voltage α(VBE−VBER) is supplied to the inverting input terminal. A non-inverting input terminal of the subtracting circuit 82 is connected to the second selecting circuit 42, so that the voltage (½)VDLYR is supplied to the non-inverting input terminal. With this configuration, a potential at the output terminal of the subtracting circuit 82 becomes VDLYR−α(VBE−VBER).

Outputs of the subtracting circuits 81 and 82 are input to the transfer gates $83_1$ and $83_2$, respectively. Outputs of the transfer gates $83_1$ and $83_2$ are connected to the internal voltage generating circuit 15A. Furthermore, code signal components VIN4(1) and VIN4(2) constituting the code signal VIN4 are input to gates of the transfer gates $83_1$ and $83_2$, respectively.

The code signal components VIN4(1) and VIN4(2) are configured in such a manner that only one code signal component is activated while the other is non-activated. Therefore, when the code signal component VIN4(1) is activated, the transfer gate $83_1$ becomes conductive while the transfer gate $83_2$ becomes nonconductive, so that the voltage VDLYR+α(VBE−VBER) is output to the internal voltage generating circuit 15A. On the other hand, when the code signal component VIN4(2) is activated, the transfer gate $83_2$ becomes conductive while the transfer gate $83_1$ becomes nonconductive, so that the voltage VDLYR−α(VBE−VBER) is output to the internal voltage generating circuit 15A.

The configuration of the semiconductor device 10 is as described above.

The tester 50 (shown in FIG. 1) is a device that performs a delay time measurement test on the semiconductor device 10 in a wafer state. The tester 50 supplies the test command to the semiconductor device 10 via the command terminal 10b, and at the same time, supplies the address signal ADD for generating the test code signal to the semiconductor device 10 via the address terminal 10c. In addition, during a test, the tester 50 monitors the delay time D (see FIG. 2B) of the reference delay circuit 19 via the data input/output terminal 10d, and performs an update of the address signal ADD for generating the test code signal based on a result of monitoring the delay time D. At the time of the test, the tester 50 also performs a supply of the external power supply voltage VDD to the semiconductor device 10.

The tester 50 includes a register 51. The register 51 is a memory unit that stores therein various data used in the test and data obtained from the test. The various data used in the test includes data indicating an optimum value of the delay time D (see FIG. 2) of the reference delay circuit 19 and the like.

Details on an operation of adjusting the delay time D of the reference delay circuit 19 by adjusting the reference potential VAREF are explained below in detail with reference to the flowchart of FIG. 11. An outline of the operation is as follows. The tester 50 appropriately changes the reference potential VAREF to be generated by the reference potential generating circuit 16 by selecting values of the code signals VIN1 to VIN4 while changing the ambient temperature in an appropriate manner. Each time the reference potential VAREF is changed, the tester 50 measures the delay time D of the reference delay circuit 19, and from a result of the measurement, stores in the fuse circuit 14 a value of a code signal (reference potential information) with which a temperature dependency of the optimum delay time D can be obtained. The operation of adjusting the delay time D is performed roughly in the above manner.

Figure 11:
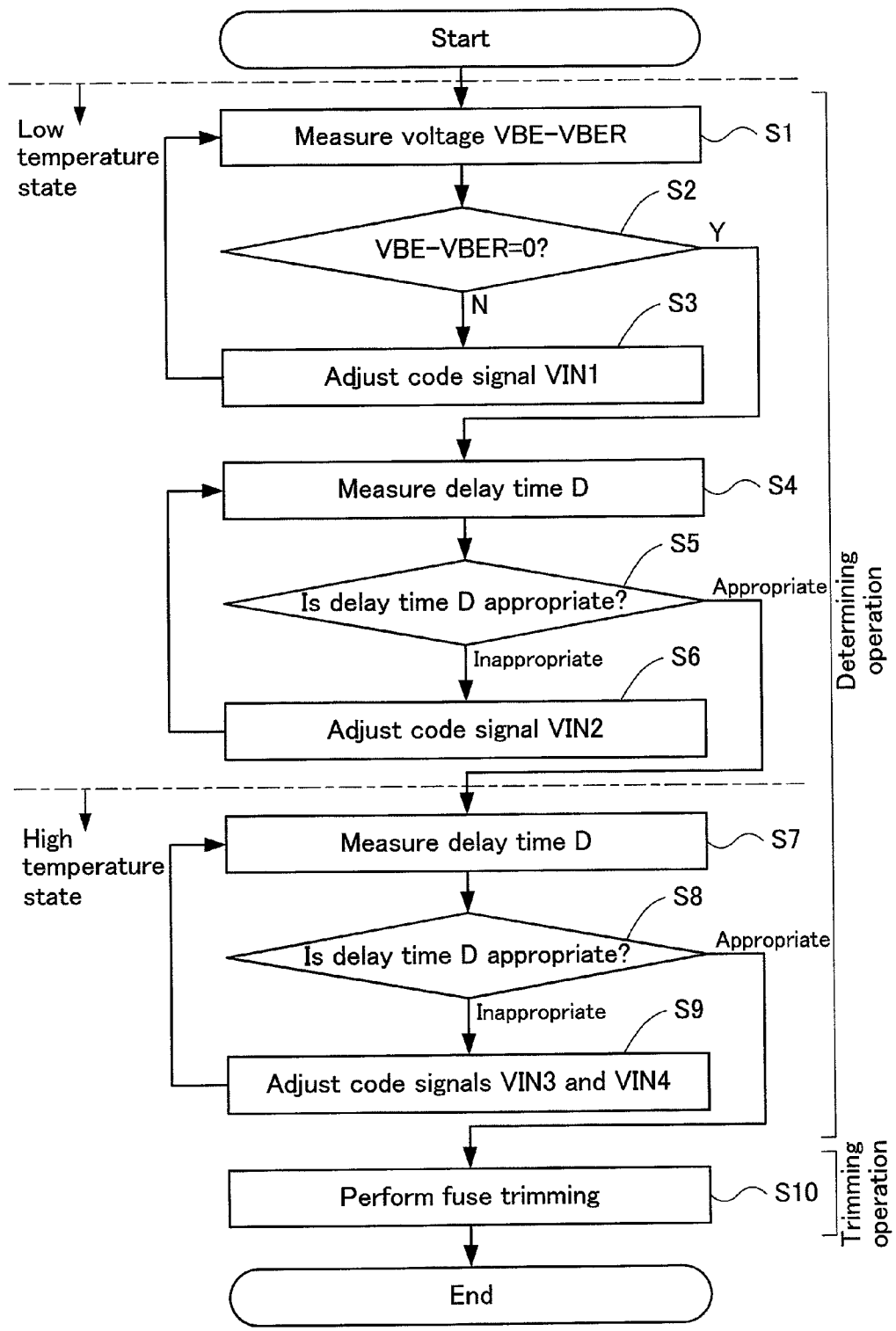
FIG. 11 is a flowchart showing the operation of adjusting the delay time by adjusting a reference potential according to an embodiment of the present invention.

FIG. 11 is a flowchart showing the operation of adjusting the delay time D by adjusting the reference potential VAREF. The operation of adjusting the delay time is roughly divided into a determining operation using the tester 50 and a writing operation in the fuse circuit 14 using a trimming apparatus (not shown).

In the determining operation using the tester 50, the ambient temperature of the semiconductor device 10 is first set to a low temperature (the lowest temperature in an operation temperature range, for example, −20° C.). Subsequently, the tester 50 supplies a test command to the semiconductor device 10 via the command terminal 10b. With a supply of the test command, the semiconductor device 10 enters the test mode in which the test signal ITEST is activated. In this state, the tester 50 supplies the test code signal TCODEn to the semiconductor device 10 via the address terminal 10c. As for a value of the test code signal TCODEn to be initially supplied, a prescribed value stored in the register 51 can be used. The tester 50 monitors a signal output from the test input/output control circuit 20 in this low temperature state, and measures the voltage VBE−VBER that is output from the output terminal 16a of the reference potential generating circuit 16 (Step S1).

Based on a result of measurement of the voltage VBE−VBER, the tester 50 determines whether the voltage VBE−VBER is zero (Step S2). When it is determined that the voltage VBE−VBER is not zero, the tester 50 adjusts a value of the code signal VIN1 by changing the test code signal TCODEn, thereby changing a value of the voltage VBER that is input from the first selecting circuit 41 to the third selecting circuit 43 (Step S3), and performs the measurement again (Step S1).

Figure 12:
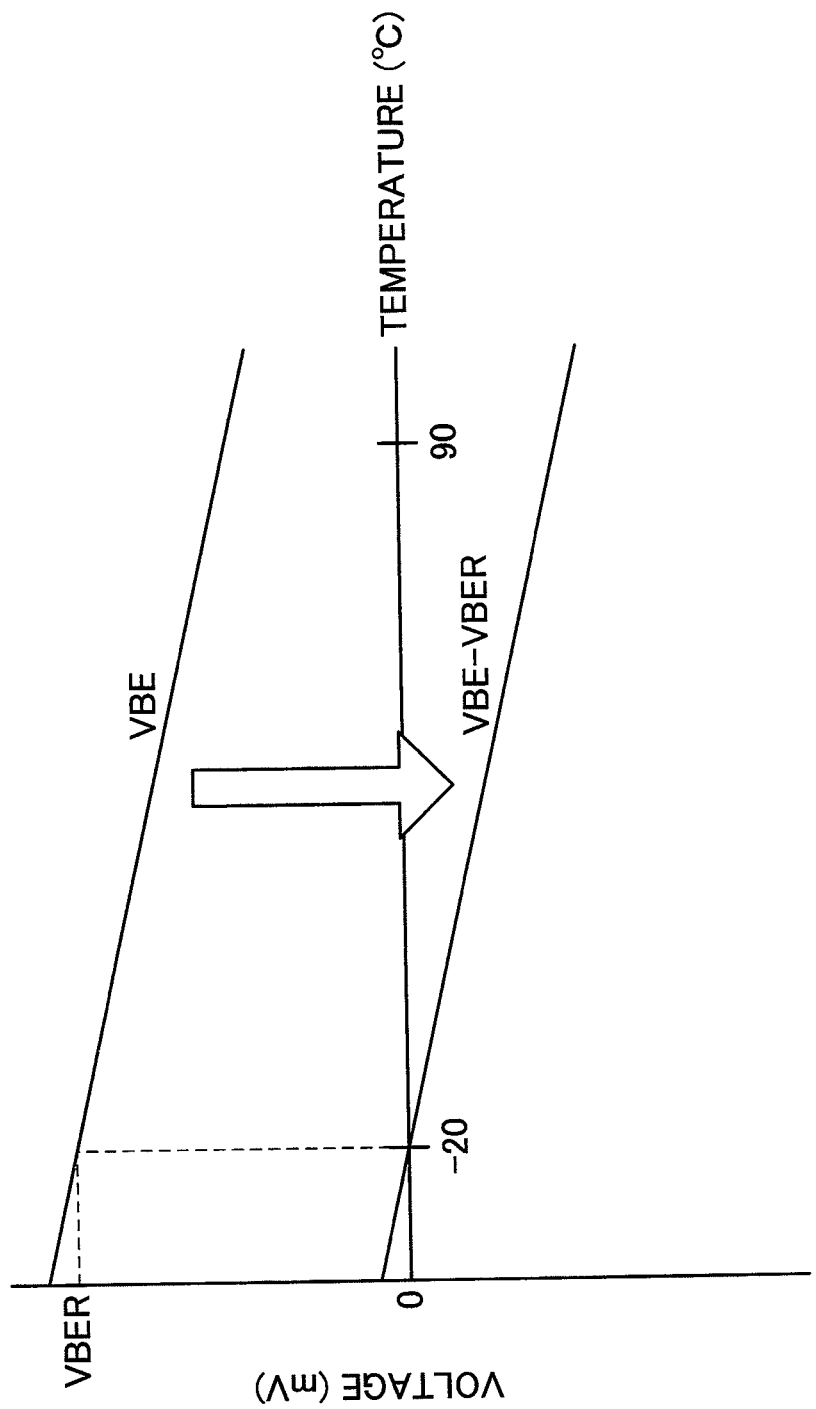
FIG. 12 is a graph showing a voltage VBE and a voltage VBE−VBER with the horizontal axis representing temperature and the vertical axis representing voltage.

FIG. 12 is a graph showing the voltage VBE and the voltage VBE−VBER with the horizontal axis representing temperature and the vertical axis representing voltage. As shown in FIG. 12, the voltage VBE has a negative temperature dependency. By performing the processes at Steps S1 to S3, the tester 50 searches for a constant voltage VBER that is equivalent to the voltage VBE at the temperature of −20° C. The voltage VBE−VBER obtained by subtracting the constant voltage VBER obtained in the above manner from the voltage VBE has the same change rate as the voltage VBE with respect to the temperature, and its value at the temperature of −20° C. becomes zero.

Referring back to FIG. 11, when a result of determination at Step S2 shows that the voltage VBE−VBER is zero, the tester 50 temporarily stores the test code signal TCODEn (the code signal VIN1) in the register 51. The tester 50 then inputs the signal TDLY0 to the reference delay circuit 19 via the data input/output terminal 10d, and obtains the signal TDLY10 that is output from the reference delay circuit 19 in response to the input of the signal TDLY0 via the data input/output terminal 10d. From these signals, the tester 50 measures the delay time D of the reference delay circuit 19 (Step S4).

The tester 50 determines whether the delay time D is an appropriate value based on a result of measurement of the delay time D (Step S5). Specifically, it suffices that the tester 50 stores optimum range data in the register 51 in advance and compares the result of the measurement with the optimum range data. When it is determined that the delay time D is not an appropriate value, the tester 50 adjusts a value of the code signal VIN2 by changing the test code signal TCODEn, thereby changing a value of the voltage (½) VDLYR that is input from the second selecting circuit 42 to the fourth selecting circuit 44 (Step S6), and performs the measurement again (Step S4).

Figure 13:
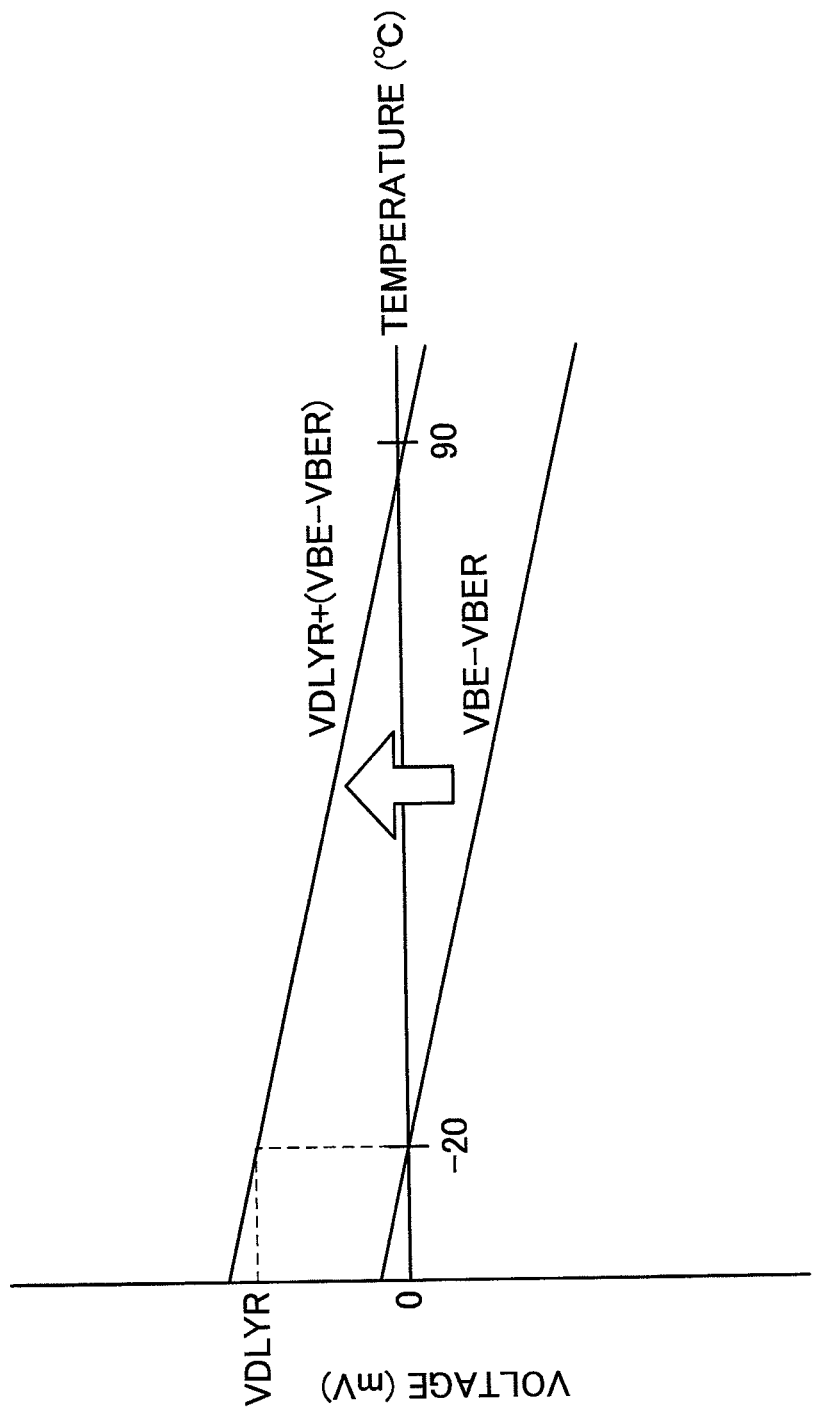
FIG. 13 is a graph showing a voltage VDLYR+α(VBE−VBER) in addition to the voltage VBE−VBER shown in FIG. 12 with the horizontal axis representing temperature and the vertical axis representing voltage.

FIG. 13 is a graph showing the voltage VDLYR+α(VBE−VBER) in addition to the voltage VBE−VBER shown in FIG. 12 with the horizontal axis representing temperature and the vertical axis representing voltage. In this graph, α=1. As shown in FIG. 13, although the value of the voltage VBE−VBER at the temperature of −20° C. is zero, a value of the reference potential VAREF with which an appropriate delay time D can be obtained at the temperature of −20° C. is not always zero.

The tester 50 searches for a value of the constant voltage VDLYR with which an appropriate delay time D can be obtained at the temperature of −20° C. by appropriately changing the value of the constant voltage VDLYR to be added to the voltage VBE−VBER in the processes at Steps S4 to S6. The voltage VDLYR+(VBE−VBER) obtained by adding the constant voltage VDLYR obtained in the above manner to the voltage VBE−VBER becomes the reference potential VAREF with which an appropriate delay time D can be obtained at the temperature of −20° C.

Referring back to FIG. 11, when it is determined that the delay time D is an appropriate value from a result of determination at Step S5, the tester 50 temporarily stores the test code signal TCODEn (the code signal VIN2) in the register 51. After that, the ambient temperature of the semiconductor device 10 is set to a high temperature (the highest temperature in an operation temperature range, for example, 90° C.). The tester 50 measures the delay time D of the reference delay circuit 19 again in this high temperature state (Step S7).

The tester 50 determines whether the delay time D is an appropriate value based on a result of measurement of the delay time D (Step S8). Specifically, it suffices that the tester 50 stores optimum range data in the register 51 in advance and compares the result of the measurement with the optimum range data. When it is determined that the delay time D is not an appropriate value, the tester 50 adjusts values of the code signals VIN3 and VIN4 by changing the test code signal TCODEn, thereby changing the coefficient α(0, 1/Q, 2/Q, . . . , (Q−1)/Q, Q/Q) of the voltage α(VBE−VBER) and the sign (the code signal VIN4) (Step S9), and performs the measurement again (Step S7).

Figure 14:
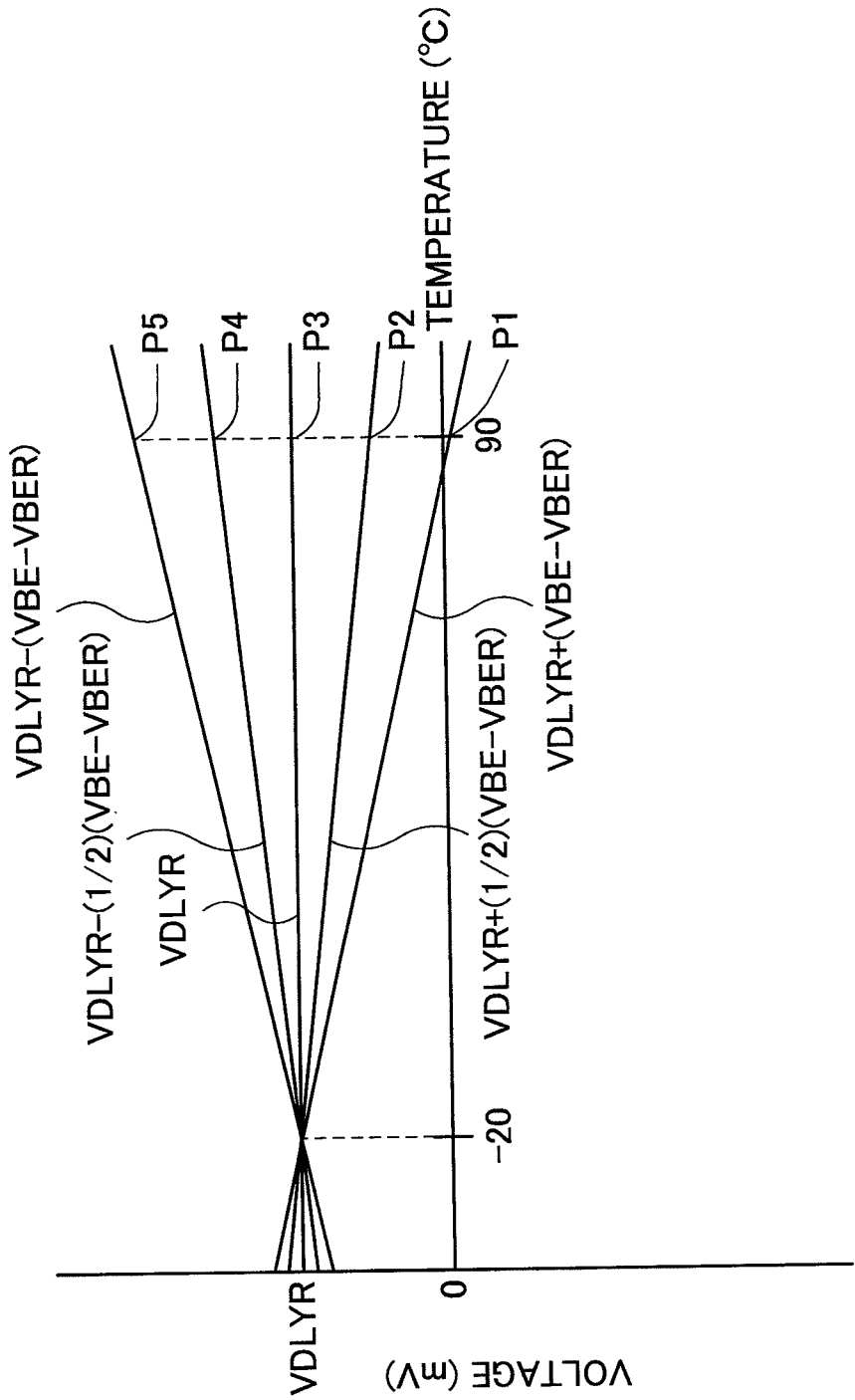
FIG. 14 is a graph showing a reference potential VAREF with the horizontal axis representing temperature and the vertical axis representing voltage.

FIG. 14 is a graph showing the reference potential VAREF with the horizontal axis representing temperature and the vertical axis representing voltage. FIG. 14 shows a case of Q=2, in which five patterns of the reference potential VAREF corresponding to values of the coefficient α and signs of the voltage α(VBE−VBER) including the case of the reference potential VAREF=VDLYR+(VBE−VBER) are plotted.

The tester 50 searches for a value of the coefficient α and a sign of the voltage α(VBE−VBER) with which an appropriate delay time D can be obtained at the temperature of 90° C. in the processes at Steps S7 to S9. In a case that Q=2 as shown in FIG. 14, the tester 50 searches for the optimum value and sign from points P1 to P5 shown in the drawing because there are only five patterns of combinations of the value of the coefficient α and the sign of the voltage α(VBE−VBER). However, when the value of Q increases, it becomes possible to search for the optimum value and sign from more points. The reference potential VAREF obtained in the above manner becomes the reference potential VAREF with which an appropriate delay time D can be obtained at both of the temperatures of −20° C. and 90° C.

When it is determined that the delay time D is an appropriate value from a result of determination at Step S8, the tester 50 temporarily stores the test code signal TCODEn (the code signals VIN3 and VIN4) in the register 51. With this operation, the determining operation using the tester 50 is completed.

Lastly, the test code signal TCODEn finally obtained from a result of the above processes is sent to a trimming apparatus (not shown) from the tester 50. The trimming apparatus then performs fuse trimming of the fuse circuit 14 based a received test code signal TCODEn (Step S10). That is, the fuse trimming of the fuse circuit 14 is performed such that the fuse code signal FCODEn that is output from the fuse circuit 14 becomes the same value as the test code signal TCODEn that is finally obtained. With this arrangement, the reference potential information for generating a reference potential VAREF with which an appropriate delay time D can be obtained at least at both the temperatures of −20° C. and 90° C. is written in the fuse circuit 14.

As described above, with the semiconductor device 10 according to the present embodiment, it is possible to set the delay time D of the reference delay circuit 19 at both a low temperature and a high temperature by adjusting the reference potential VAREF using fuse trimming. Furthermore, it is also possible to adjust a delay amount to an appropriate value in the internal circuit 12 (in FIG. 1) that is operated by the internal power source voltage VA generated by the reference potential VAREF. Specifically, when the internal circuit 12 is a circuit that should decrease its operation speed with an increase of the temperature, it suffices to use a reference potential VAREF that has a negative temperature dependency so that the reference potential VAREF decreases with an increase of the temperature. On the other hand, when the internal circuit 12 is a circuit that should increase its operation speed with an increase of the temperature, it suffices to use a reference potential VAREF that has a positive temperature dependency so that the reference potential VAREF increases with an increase of the temperature. In addition, when the internal circuit 12 is a circuit that should maintain its operation speed regardless of an increase of the temperature, it suffices to use a reference potential VAREF that has a temperature dependency with which the reference potential VAREF is substantially unchanged regardless of an increase of the temperature.

With reference to a specific example of the internal circuit 12, details on a control of its delay amount are explained below.

Figure 15:
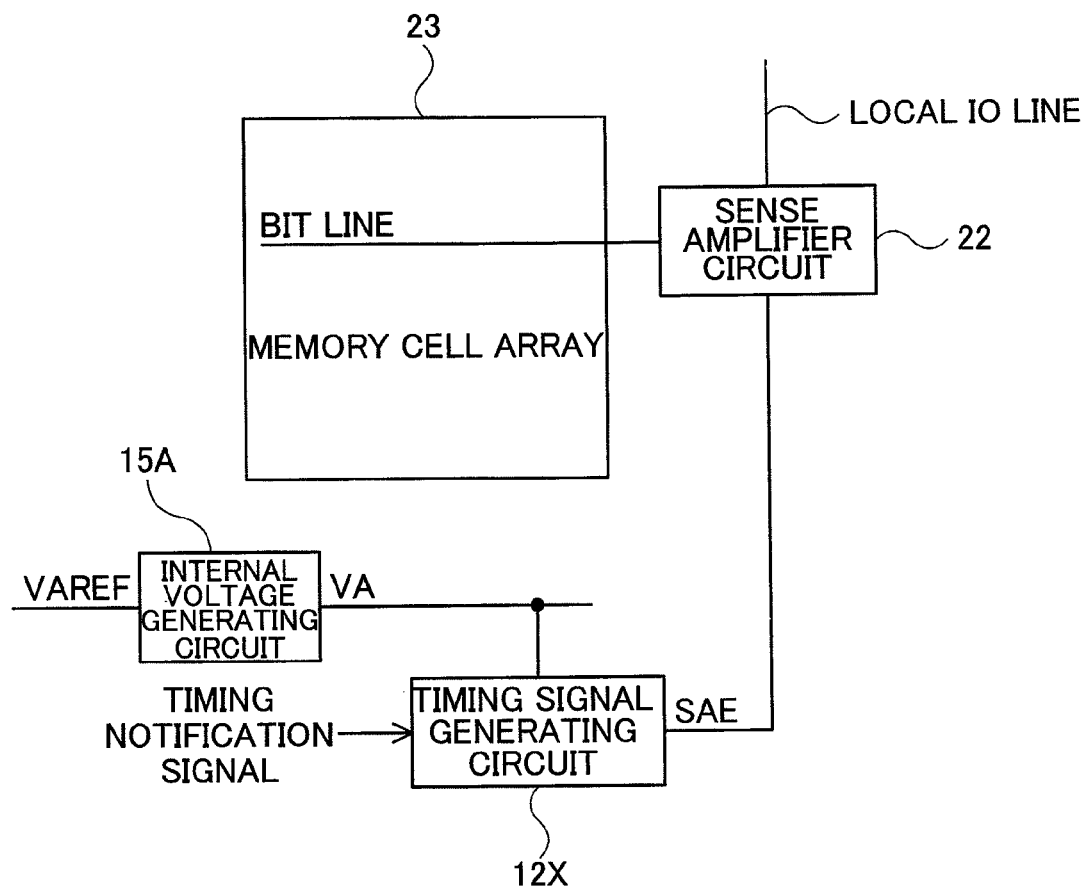
FIG. 15 shows an internal circuit according to an embodiment of the present invention.

FIG. 15 shows a timing signal generating circuit 12X that generates a timing signal to be supplied to a sense amplifier circuit 22. In this example, the timing signal generating circuit 12X is the internal circuit 12. The timing signal generating circuit 12X is considered as one of the circuits in which a delay amount should be increased as the ambient temperature of the semiconductor device 10 increases (a circuit that should decrease its operation speed with an increase of the temperature). Details on the timing signal generating circuit 12X and its operation are explained below.

The sense amplifier circuit 22 is a circuit that amplifies data (a potential difference) generated on a bit line by an electric charge accumulated in a memory cell of a memory cell array 23 and outputs amplified data to a local IO line. The timing signal generating circuit 12X is a circuit that generates a sense amplifier enable signal SAE for activating the sense amplifier circuit 22 in response to a timing notification signal indicating that a read command or a write command is input.

The amount of the data (the amount of the potential difference) generated on the bit line by the electric charge accumulated in the memory cell decreases as the ambient temperature of the semiconductor device 10 increases.

Therefore, it is desirable that an activation timing of the sense amplifier circuit 22 should be delayed as the ambient temperature increases.

In the present invention, the reference potential VAREF has a negative temperature dependency by a control of the tester 50. Therefore, a potential of the power supply voltage VA decreases as the ambient temperature increases. As a result, the delay amount of the timing signal generating circuit 12X increases. An output timing of the sense amplifier enable signal SAE is then delayed, so that the activation timing of the sense amplifier circuit 22 is delayed. In other words, it is implemented to delay the activation timing of the sense amplifier circuit 22 as the ambient temperature increases.

It is apparent that the present invention is not limited to the above embodiments, but may be modified and changed without departing from the scope and spirit of the invention.

For example, although activation information of a power supply unit is written in the fuse circuit 14 in the above embodiment, the fuse circuit referred herein includes a laser trimming fuse and a fuse that is electrically blown/made conductive (including an antifuse). Because an antifuse circuit stores therein information by an electrical signal processing, it is advantageous in that the reference potential information can be written in a state where the tester 50 and the semiconductor device 10 are connected to each other.

Figure 16:
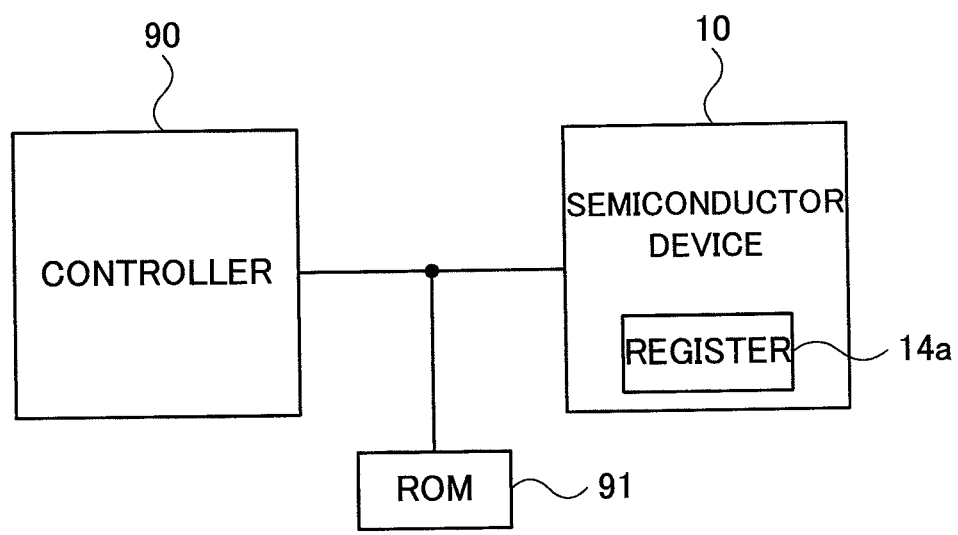
FIG. 16 is a system configuration diagram of a semiconductor device according to an customized example using a controller instead of the tester.

Furthermore, although the adjustment of the reference potential is performed when the semiconductor device 10 is in a wafer state in the above embodiment, the adjustment can also be performed, as shown in FIG. 16, after the semiconductor device 10 is incorporated in an apparatus such as a computer, using a controller (CPU) 90 of the computer. A ROM (Read Only Memory) 91 shown in FIG. 16 is a storage unit that stores therein a program for performing the determining operation and the like described above in the computer. The controller 90 performs the process of adjusting the reference potential following the program stored in the ROM 91. In this case, it is preferable to use a rewritable data storage unit such as a register (a latch circuit) 14a instead of the fuse circuit 14, such that the controller 90 can write the reference potential information in the register 14a.

Moreover, although an example of performing an adjustment of the delay amount focusing only on the reference potential VAREF is described in the above embodiment, it is preferable that the same adjustment of the delay amount should be performed for the other reference potentials (VBREF, VCREF, and the like). In this case, it is preferable to use a configuration in which the internal power supply voltage to be input to the reference delay circuit 19 can be appropriately switched.

Figure 17:
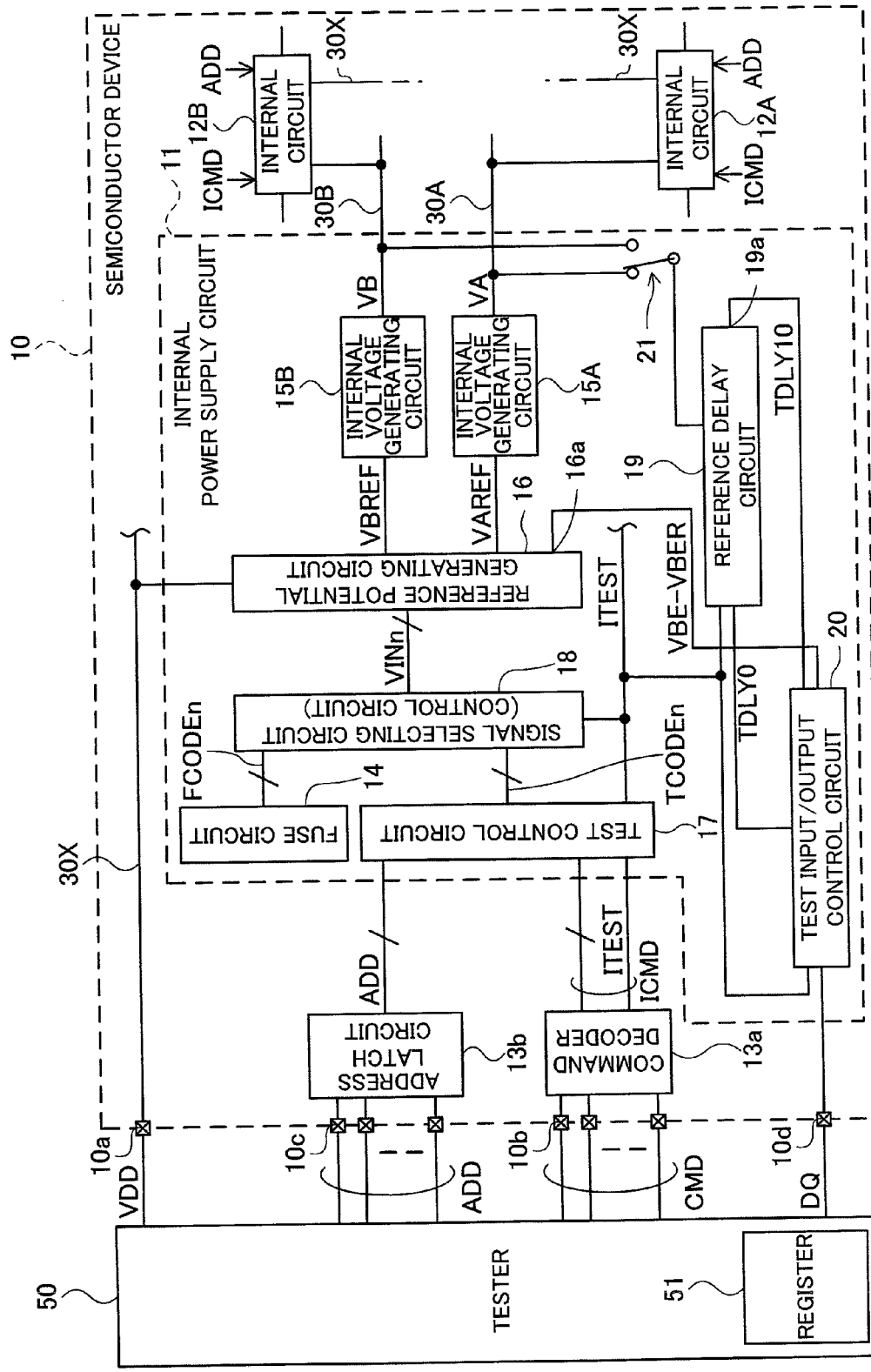
FIG. 17 is a schematic block diagram showing functional blocks of a semiconductor device according to a customized example of an embodiment of the present invention and a tester that performs a test of the semiconductor device.

FIG. 17 shows an example of the semiconductor device 10 in which an adjustment of the delay amount can be performed for the reference potentials VAREF and VBREF. The internal voltage generating circuit 15C is omitted in FIG. 17.

In the example, shown in FIG. 17, the reference delay circuit 19 is connected to the internal power supply lines 30A and 30B via a switch 21. The power supply voltage of the reference delay circuit 19 becomes either one of the power supply voltages VA and VB according to a switching state of the switch 21. Although it is not explicitly shown in FIG. 17, the switch 21 is configured to be switchable from the tester 50.

When adjusting the reference potential VAREF such that the delay amount of an internal circuit 12A that is operated by the internal power supply voltage VA becomes an appropriate value, the tester 50 switches the switch 21 such that the power supply voltage VA is supplied to the reference delay circuit 19. On the other hand, when adjusting the reference potential VBREF such that the delay amount of an internal circuit 12B that is operated by the internal power supply voltage VB becomes an appropriate value, the tester 50 switches the switch 21 such that the power supply voltage VB is supplied to the reference delay circuit 19. With this operation, the tester 50 can adjust the delay amounts of both the internal circuits 12A and 12B to appropriate values.

Because the delay amount of the internal circuit can be adjusted for each power supply voltage, for example, it is also possible to such a control that the delay amount increases as the temperature increases (the operation speed decreases with an increase of the temperature) in a similar manner as the operation of the timing signal generating circuit 12X described above for the internal circuit 12A to which the power supply voltage VA is supplied and the delay amount decreases as the temperature increases (the operation speed increases with an increase of the temperature) for the internal circuit 12B to which the power supply voltage VB is supplied.

In addition, while not specifically claimed in the claim section, the applicant reserves the right to include in the claim section of the application at any appropriate time the following methods:

A1. A method of manufacturing a semiconductor device comprising:

providing the semiconductor device including a reference potential generating circuit that generates one of a plurality of reference potentials having different temperature dependencies from each other and supplies a generated reference potential to an internal voltage generating circuit that supplies the power supply voltage to an internal circuit and a storage circuit that stores therein reference potential information indicating a reference potential to be generated by the reference potential generating circuit;

selecting the reference potential to be generated by the reference potential generating circuit;

measuring a delay amount of the internal circuit when a power supply voltage generated by the internal voltage generating circuit is supplied to the internal circuit; and writing reference potential information in the storage circuit based on a result of said measuring.

A2. The method of manufacturing a semiconductor device as claimed in claim A1, wherein selecting the reference potential includes selecting the reference potential in a state where an ambient temperature is set to a first temperature and selecting the reference potential in a state where the ambient temperature is set to a second temperature that is different from the first temperature, and writing the reference potential information is performed based on a result of said measuring at each of the first and second temperature.

A3. The method of manufacturing a semiconductor device as claimed in claim A1, wherein the semiconductor device further includes a delay circuit including an inverter chain that is operated by the power supply voltage generated by the internal voltage generating circuit, and the delay amount of the internal circuit is measured by measuring a delay time of the delay circuit.

B1. A method of manufacturing a semiconductor device comprising:

providing the semiconductor device using a power supply voltage that is defined as a sum of a first voltage in which its voltage value is changed with a change of temperature and a change amount of the voltage value can be adjusted and a second voltage in which its voltage value is not changed with a change of temperature;

determining the second voltage at a first temperature; and adjusting the change amount at a second temperature that is different from the first temperature.

What is claimed is:

1. A semiconductor device comprising:
   a reference potential generating circuit generating a plurality of reference potentials in parallel to each other, the reference potentials being different in temperature dependency from each other;
   a control circuit that selects one of the reference potentials;
   an internal voltage generating circuit that generates a power supply voltage with reference to the one of the reference potentials; and
   an internal circuit that is supplied with the power supply voltage, wherein
   the reference potential generating circuit includes a voltage generating circuit that generates a first voltage having a temperature dependency and second and third voltages having no temperature dependency, and is configured to be capable of selecting a voltage value of the second voltage, a voltage value of the third voltage, a change coefficient to be multiplied by a fourth voltage that is obtained by subtracting the second voltage from the first voltage, and a sign of a fifth voltage that is obtained by multiplying the change coefficient by the fourth voltage, and
   the reference potential is generated by adding the third voltage to the fifth voltage.

2. The semiconductor device as claimed in claim 1, wherein the reference potentials include a first reference potential that rises in accordance with increase of a temperature and a second reference potential that falls in accordance with increasing of the temperature.

3. The semiconductor device as claimed in claim 1, wherein the reference potentials include first and second potentials rising in accordance with increasing of a temperature, and being different in potential rising rate from each other.

4. The semiconductor device as claimed in claim 1, wherein the reference potentials being equal to each other at a predetermined temperature.

5. The semiconductor device as claimed in claim 1, wherein the control circuit selects the reference potential based on information stored in a storing circuit that stores therein the information indicating the reference potential to be generated by the reference potential generating circuit.

6. The semiconductor device as claimed in claim 1, wherein the control circuit selects the reference potential based on a test code signal that is supplied from outside.

7. A semiconductor device comprising:
   a reference potential generating circuit including first and second terminals, the reference potential generating circuit being configured to generate first and second reference potentials such that the first reference potential goes up and the second reference potential goes down in accordance with a temperature increase of the semiconductor device, the reference potential generating circuit being configured to supply the first and second reference potentials respectively to the first and second terminals;
   a control circuit coupled to the first and second terminals of the reference potential generating circuit to be supplied with the first and second reference potentials, the control circuit including a third terminal and being configured to supply the third terminal with one of the first and second reference potentials;

an internal voltage generating circuit coupled to the third terminal to be supplied with the one of the first and second reference potentials, and the internal voltage generating circuit being configured to generate a power supply voltage with reference to the one of the first and second reference potentials; and an internal circuit supplied with the power supply voltage.

8. The semiconductor device as claimed in claim 7, wherein the reference potential generating circuit is configured to generate the first and second reference potentials such that the first potential is going down and the second potential is going up in accordance with decrease of the temperature of the semiconductor device.

9. The semiconductor device as claimed in claim 8, wherein the first and second reference potentials become equal to each other when the temperature of the semiconductor device takes a predetermined degree.

10. The semiconductor device as claimed in claim 7, the control circuit includes a first switching circuit coupled between the first and third terminals and a second switching circuit coupled between the second and third terminals, the control circuit being configured to turn on one of the first and second switch circuit and turn off the other of the first and second switch circuit to supply the third terminal with the one of the first and second potentials.

* * * * *